United States Patent
Floro et al.

(10) Patent No.: US 6,822,346 B2
(45) Date of Patent: Nov. 23, 2004

(54) BATTERY BACKED MEMORY WITH BATTERY DISCONNECT FOR IMPROVED BATTERY LIFE

(75) Inventors: William Edward Floro, Willoughby, OH (US); Frank Joseph Priore, Willoughby Hills, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 122 days.

(21) Appl. No.: 10/059,061

(22) Filed: Jan. 29, 2002

(65) Prior Publication Data

US 2003/0142574 A1 Jul. 31, 2003

(51) Int. Cl.[7] .................................................. H02J 7/00
(52) U.S. Cl. ............................................................ 307/66
(58) Field of Search ................................... 307/66, 130

(56) References Cited

U.S. PATENT DOCUMENTS

| | | | | |
|---|---|---|---|---|
| 4,528,459 A | * | 7/1985 | Wiegel | 307/66 |
| 5,241,508 A | * | 8/1993 | Berenguel et al. | 307/66 |
| 5,359,569 A | * | 10/1994 | Fujita et al. | 365/229 |
| 5,590,340 A | * | 12/1996 | Morita et al. | 395/750 |
| 5,798,961 A | * | 8/1998 | Heyden et al. | 365/52 |
| 5,799,200 A | * | 8/1998 | Brant et al. | 395/750.08 |
| 5,828,823 A | * | 10/1998 | Byers et al. | 395/182.22 |
| 5,831,351 A | * | 11/1998 | Khosrowpour et al. | 307/139 |
| 5,889,933 A | * | 3/1999 | Smith | 395/182.2 |
| 5,944,828 A | * | 8/1999 | Matsuoka | 713/323 |
| 6,079,026 A | * | 6/2000 | Berglund et al. | 713/340 |
| 6,362,541 B1 | * | 3/2002 | Kawata | 307/66 |
| 6,473,355 B2 | * | 10/2002 | Caulkins | 365/228 |

* cited by examiner

*Primary Examiner*—Gregory J. Toatley, Jr.
(74) *Attorney, Agent, or Firm*—Quarles & Brady LLP; R. Scott Speroff

(57) ABSTRACT

Battery backed memory for use in an industrial controller allows software disconnect of the battery and memory so that unplanned power outages may receive the benefit of battery backup, but battery power is not unduly wasted during planned power outages when data loss may be accommodated or other provisions may be made for saving data in nonvolatile memory.

16 Claims, 1 Drawing Sheet

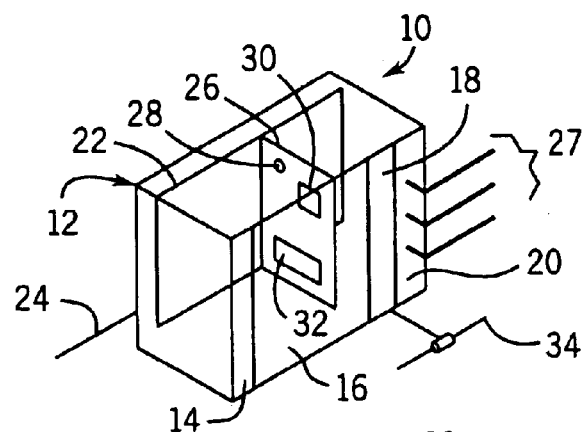
FIG. 1
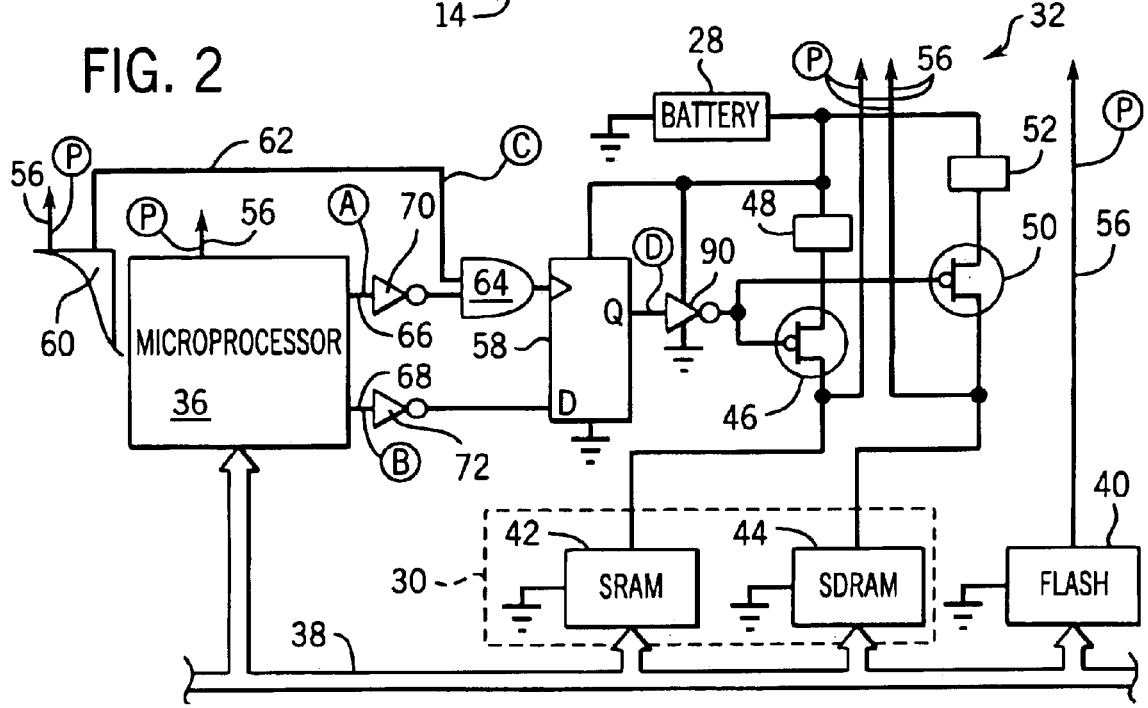
FIG. 2
FIG. 3

BATTERY BACKED MEMORY WITH BATTERY DISCONNECT FOR IMPROVED BATTERY LIFE

CROSS-REFERENCE TO RELATED APPLICATIONS

--

STATEMENT REGARDING FEDERALLY SPONSORED RESEARCH OR DEVELOPMENT

--

BACKGROUND OF THE INVENTION

The invention relates generally to industrial control systems, and more specifically to an industrial control system having a battery backed solid-state memory, the battery preventing loss of data during momentary power interruptions.

Industrial controllers are special purpose computers used for the control of industrial processes and the like. While executing a stored program, they read inputs from the controlled process and, according to the logic of a contained control program, provide outputs to the controlled process.

Industrial controllers differ from regular computers both in that they provide "real-time" control (i.e., control in which control outputs are produced predictably and rapidly in response to given control inputs) and in that they provide for extremely reliable operation. In this latter regard, the volatile memory used by the industrial controller is often backed up with a battery so that data needed for the control program is not lost during momentary power outages. Volatile memory is that which requires power to maintain its stored data.

Such "battery backed" memory, using a combination of static random access memory (SRAM) and a long life battery such as a lithium cell, is well known. In current control applications, synchronous dynamic random access memory (SDRAM) may be preferred to SRAM because of its higher density, faster speed, and lower cost. Unfortunately, the amount of power needed for SDRAM can be thirty times greater than that needed for conventional SRAM devices. The voltage requirements of SDRAM require that the lithium cell voltage be stabilized with a DC-to-DC converter, introducing additional power losses of about 25 percent. High speed SRAM is one alternative, but high-speed SRAM still draws about ten times as much current as the older SRAM devices, has much lower density than SDRAM in number of bits of storage per device, and costs much more than SDRAM per device.

Many customers wish to disconnect power from their industrial controllers during the night, over weekends, and during scheduled factory shutdowns. The high power requirements of SDRAM and high speed SRAM produce unacceptable battery drain in these situations. At times, it may be desirable to ship an industrial controller preprogrammed from the factory. The one-month or more of transport time make battery back-up of the programmed data impractical.

BRIEF SUMMARY OF THE INVENTION

The present invention allows automatic deactivation of the battery backup for periods of planned power outage. In this way, memory devices having high power consumption may be provided with battery back up during short periods of unexpected power loss, without risk of high battery discharge levels during longer scheduled shutdowns. The invention may include nonvolatile (e.g., Flash) memory into which selected data from the volatile memory may be saved prior to a planned shut down.

Specifically, the present invention provides a battery backed memory system having a first line receiving a source of line voltage and a second line receiving a source of battery voltage to provide backup voltage when the line voltage is lost. A volatile solid-state memory receives voltage from the first line, and from the second line via an electronically controlled switch. A microprocessor communicating with the volatile solid-state memory and the electronically controlled switch, executes a program to open the electronically controlled switch in response to a signal indicating a planned cessation of line voltage.

Thus it is an object of the invention to distinguish between and respond differently to power outages that are unexpected and that require battery backup and those which are planned in which battery backup may not be required.

The system may further include nonvolatile solid state memory communicating with the microprocessor and the executed program may operate to transfer predetermined data from the volatile solid state memory to the nonvolatile solid state memory in response to the signal indicating a planned cessation of line voltage and prior to opening of the electronically controlled switch.

Thus it is an object of the invention to allow storage of data in nonvolatile memory when a planned power outage is incurred, thus eliminating loss of critical data, and to allow for such a transfer while line voltage is present to ameliorate the power demands of programming common non-volatile memories.

The invention may include a latch connected between the microprocessor and the electronically controlled switch so that the electronically controlled switch is latched open even after loss of power to the microprocessor.

Thus it is another object of the invention to allow the microprocessor to be fully powered down during loss of line voltage without affecting the disconnection of the battery from the volatile memory.

The invention may include circuitry for resetting the latch upon restoration of line voltage to the first line.

Thus it is another object of the invention to ensure that battery backup is reestablished on next power up after an unplanned power outage without the necessity of resetting by the microprocessor.

The volatile memory may include static and dynamic random access memory.

Thus it is another object of the invention to provide a system that works not only with high current dynamic memories but also faster, higher current static memory systems.

The system may include a DC-to-DC converter for use with the dynamic access memory and a voltage regulator for use with the static memory.

Thus it is another object of the invention to provide improved battery backup operation for memory systems that include efficiency decreasing, regulation, or DC-to-DC conversions.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

BRIEF DESCRIPTION OF THE DRAWINGS

FIG. 1 is a simplified perspective view in phantom showing a processor board within an industrial controller, the former which may include a battery backing up a volatile memory;

FIG. 2 is a schematic representation of the present invention showing a microprocessor having an output communicating through a latch with a switch connected to disconnect battery backup from volatile memory during a planned power outage; and FIG. 3 is a timing diagram showing the signals at specific locations on the schematic of FIG. 2 during initial application of power to the industrial controller, an unanticipated power loss, and a planned shut down according to the present invention.

DETAILED DESCRIPTION OF THE INVENTION

Referring now to FIG. 1, an industrial controller 10 may include a chassis 12 incorporating a number of modules 14, 16, 18, and 20 interconnected by means of backplane 22.

In particular, a power supply module 14 provides power from a line source 24 and regulates the power for distribution along the backplane 22 to the other modules 16, 18, and 20. A processor module 16 receives data along the backplane 22 from a network module 18 or an I/O module 20. The network module 18 provides an interface with a communication network 34 such as EtherNet, or ControlNet to receive system control data or data from other I/O modules. The I/O module 20 provides an interface for input and output signals along I/O lines 27 communicating with the controlled process or machine. Generally, during operation of the industrial controller 10, a program executed by the processor module 16 reads this input data to create output data that is then returned along the backplane 22 from a network module 18 or an I/O module 20.

The processor module 16 includes an internal processor circuit board 26 containing a battery 28, volatile memory 30, and processor circuitry 32.

Referring now to FIG. 2, the battery may be a lithium battery as is generally known in the art. Such batteries are not rechargeable and hence must be replaced when their power is exhausted. The volatile memory 30 may include static random access memory (RAM) 42 and synchronous dynamic random access memory (SDRAM) 44, both of which require application of power to maintain their memory states. The processor circuitry 32 includes a microprocessor 36 communicating via an internal data and address bus 38 with the volatile memory 30 and nonvolatile memory 40 which together contain control data and the control program. The non-volatile memory may be so called "flash" memory well known in the art.

According to methods well known in the art, the microprocessor 36 reads or writes to the volatile memory 30 or non-volatile memory 40 as is necessary to execute the control program. The microprocessor 36 may also communicate over bus 38, or via a similar mechanism, with the backplane 22 and hence with I/O modules 20 or network module 18.

Referring still to FIG. 2, power for the SRAM 42 is received through a transistor 46, which in turn receives power from a voltage regulator 48 of conventional design, connected to battery 28. The regulator voltage is adjusted to the necessary voltage for the particular SRAM 42. Generally voltage regulators operate to controllably reduce voltage. Similarly, power for the SDRAM 44 is received through a transistor 50 which in turn receives power from DC-to-DC converter 52 of conventional design, connected to battery 28. Again, the DC-to-DC converter 52 is adjusted to the necessary voltage for the particular SDRAM 44. The DC-to-DC converter operates to maintain the desired voltage to the memory with an input battery voltage above or below the desired voltage to the memory.

The SRAM 42 and SDRAM 44 also have a connection to line power 56 obtained from the power supply module 14 through the backplane 22. Thus, when line power 56 is available, no current need be or is drawn through transistors 46 and 50 preventing current drain on battery 28 and saving its capacity instead for periods of unexpected interruption of line power 56.

The non-volatile memory 40 is connected to line power 56, as it does not require battery back up because it does not lose data when power is lost.

The transistors 46 and 50 receive at their controlling inputs the output of an inverter 90 whose input is a signal (D) output from a latch 58. In the example shown, the transistors 46 and 50 may be p-channel field effect transistors passing current from their drain to source upon application of a low state voltage at their gates. Thus, a high or set state of the output of the latch 58 will turn on transistors 46 and 50 allowing current flow to the SRAM 42 and SDRAM 44, whereas a low or reset state of the output of the latch 58 will turn off transistors 46 and 50 preventing current flow to the SRAM 42 and SDRAM 44. It will be understood that the particular voltage considered to be the "set" state is arbitrary and for the purposes of the claims herein, the terms "set" and "reset" should be construed to embrace either high or low voltages according to the necessary logic to be effected by the present invention.

Latch 58 and inverter 90 may be powered directly from the battery 28, bypassing transistors 46 and 50 so as to maintain their states even with loss of line power 56 or switching of the transistors 46 and 50.

The microprocessor 36 provides two output lines 66 and 68 which may be controlled by the program executed by the microprocessor 36. Each output line 66 and 68 is received, respectively, by one inverter 70 and 72. The output of inverter 70 is received by a first input of a dual input AND gate 64.

Associated with the microprocessor 36 of the processor circuitry 32 is reset timing circuitry 60 receiving line power 56 to provide a series of reset signals 62 needed to properly initialize the microprocessor 36 and other circuitry when power is first applied to the processor circuitry 32. Such circuitry is well known in the art. The reset signal 62 of the reset timing circuitry 60 rises shortly after power is first applied to the processor circuitry 32 and is received by the second input of the dual input AND gate 64.

The output of the dual input AND gate 64 is received by the clock input of a standard D-type latch 58 whereas the output of inverter 72 is received by the data input of the latch 58. Thus generally, control of the latch 58 is provided by the reset signal 62 and the two output lines 66 and 68.

Referring now to FIG. 3, at a time prior to the application of line power 56 to the processor circuitry 32, indicated by interval 76, reset signal 62 indicated as waveform (C), output line 66 indicated as waveform (A) and, output line 68 indicated as waveform (B) will all be low. Upon application of line power 56, indicated by a vertical dotted line 78, power to the volatile memory 30 (shown in FIG. 3) will rise indicated by waveform (P) to a predetermined normal voltage necessary for supplying power to the non-volatile memory 40, the microprocessor 36, and the reset timing circuitry 60. Whereas a single power level is indicated, more generally different voltages will be provided by power supply module 14 to the various devices of SRAM 42 and SDRAM 44.

At a predetermined interval 80 after the application of power, a rising edge of reset signal 62 (waveform (C)) will occur. Insofar as microprocessor output lines 66 and 68 remain low during normal start-up of the microprocessor, the output of the AND gate 64 will provide a rising edge clocking the latch 58 while a high value will be applied to latch input D from inverter 72.

The result is a high or set latch output which, through the operation of transistors 46 and 50, will connect the SRAM 42 and the SDRAM 44 to battery power from battery 28 as has been described above in addition to their connection to line power 56. Line power 56 may be attached to SRAM 42 and SDRAM 44 in a manner so as to inhibit power being drained from the battery so long as line power 56 is present. For example, this may be done by back biasing a diode junction or the like.

Referring again to FIG. 3, after this time, a power interruption 82 causing a loss of line power 56 will cause power from battery 28 to be conducted by transistors 46 and 50 through to the SRAM 42 and SDRAM 44 preventing loss of data on these devices. After this time, as indicated by vertical dotted line 84, a planned shutdown signal may be received by the microprocessor 36. The planned shutdown signal may, for example, be received as a dedicated input from a front panel control (not shown) or received through bus 38 on the industrial controller (and thus from the network 34 or an I/O line 27 or as a software command implemented as a portion of the controlled program executed by the microprocessor. The planned shutdown signal, as the name implies, indicates that a planned interruption of line power 56 will occur.

At this time, during a data storage interval 86, the microprocessor 36 may cause a transfer of predetermined data from SRAM 42 and SDRAM 44 to the non-volatile memory 40 using the available line power 56 to implement the writing to the non-volatile memory 40. The predetermined data is that selected by the programmer based on the particular application of the industrial controller, but may include programs and program data values and or I/O values.

At the conclusion of the data storage interval 86, the microprocessor 36 may change output line 68 and may pulse output line 66 to cause the output of the latch 58 (signal (D)) to be reset at vertical line 88 turning off transistors 46 and 50. In this way, when line power 56 is lost, unlike during interruption 82, there is no drain on battery 28.

The latch 58 is connected directly to the battery 28 and so remains powered during the turning off of transistors 46 and 50. The relatively low power requirements of the latch 58 do not cause a significant drain on the battery 28. With the latch 58 holding the transistors 46 and 50 off, power may be cut to the microprocessor 36 with or without transistors 46 and 50 turning on again. Thus the circuit allows current drain on the battery 28 to be minimized.

Generally, the planned shutdown signal precedes a controlled shut down of the industrial controller 10, for example, in evenings or at night so as to save power or may be powering down prior to shipping of the industrial controller 10 to a customer with critical data stored in the non-volatile memory 40. By eliminating the drain of the volatile memory 30 on the battery 28, battery life can be increased dramatically, typically from one week to one year or more. It will be understood, however, that all current drain on the battery is not necessarily prohibited. For example, a real-time clock may also be connected to the battery 28 on a permanent basis.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. A high reliability industrial controller for providing uninterrupted control operation comprising:

a volatile solid state memory holding a control program;

a processor executing the control program;

means for providing continuous battery backup to the volatile solid state memory during unplanned loss of line voltage; and means for receiving an electrical signal from the user disabling the battery backup in the event of a planned loss of line voltage;

further including a non-volatile, solid-state memory communicating with the microprocessor wherein the microprocessor executes a program to transfer predetermined data from the volatile solid-state memory to the non-volatile, solid-state memory response to the electrical signal from the user indicating a planned cessation of line voltage prior to disabling the battery backup;

whereby the battery backup power is not unnecessarily depleted.

2. The high reliability industrial controller of claim 1 further including a latchable electronically controlled switch between the means or providing continuous battery backup and the volatile solid state memory whereby the electronically controlled switch is latched open upon receiving the disabling electrical signal even after loss of power to the circuit.

3. The high reliability industrial controller of claim 2 wherein the latch receives voltage from the means for providing continuous battery backup.

4. The high reliability industrial controller of claim 2 including circuitry for resetting the latch upon restoration of line voltage.

5. The high reliability industrial controller of claim 1 wherein the volatile memory includes memory selected from the group consisting of static and dynamic random access memory.

6. The high reliability industrial controller of claim 5 further including a DC/DC converter and wherein the dynamic random access memory receives voltage from the means for providing continuous battery backup via the DC/DC converter.

7. The high reliability industrial controller of claim 5 further including a voltage regulator circuit and wherein the static random access memory receives voltage from the means for providing continuous battery backup via the voltage regulator circuit.

8. A method of controlling a battery backed memory system in a high reliability industrial controller, the battery backed memory receiving a source of line power from a first line and receiving battery power from a second line to provide backup voltage when line power is lost; the battery backed memory further having: an electronically controlled switch; a volatile solid state memory receiving power from the first line and further receiving power from the second line via the electronically controlled switch; and a circuit communicating with the volatile solid state memory and the electronically controlled switch: and a non-volatile solid-state memory communicating with a microprocessor, the method comprising the steps of:

(a) during a period when line power is present, providing power to the volatile solid state memory via the first line;

(b) during a period of unplanned loss of line power, causing the circuit to hold the electronically controlled switch closed to provide power to the volatile solid state memory via the second line;

(c) during a period of planned loss of line power, causing the circuit to open the electronically controlled switch; and (d) transferring predetermined data from the volatile solid-state memory to the non-volatile solid-state memory in response to the signal indicating a planned cessation of line power prior to opening the electronically controlled switch.

9. The method of claim 8 wherein the battery backed memory system further includes a latch connected between the circuit and the electronically controlled switch and including the step of latching the electronically controlled switch open even after loss of power to the circuit.

10. The method of claim 9 wherein the latch receives battery power from the second line.

11. The battery backed memory system of claim 10 further including the step of resetting the latch upon restoration of line power on the first line.

12. The method of claim 8 wherein the volatile memory is dynamic random access memory receiving power from the second line via a DC/DC converter.

13. The method of claim 8 wherein the volatile memory is static random access memory receiving power from the second line via a power regulator circuit.

14. The battery backed memory system of claim 8 further including a user operated control providing the signal indicating the planned cessation of line power.

15. The battery backed memory system of claim 8 wherein the circuit includes a microprocessor executing a stored program.

16. The method of claim 8 including the step of receiving the signal indicating the planned cessation of line power from a user operated control.

* * * * *